United States Patent [19]

Knapp

[11] 4,241,316
[45] Dec. 23, 1980

[54] FIELD EFFECT TRANSCONDUCTANCE AMPLIFIERS

[75] Inventor: Richard P. Knapp, Hermosa Beach, Calif.

[73] Assignee: Lawrence Kavanau, Long Beach, Calif. ; a part interest

[21] Appl. No.: 4,572

[22] Filed: Jan. 18, 1979

[51] Int. Cl.³ .............................................. H03F 3/16
[52] U.S. Cl. .................................. 330/277; 330/151; 330/300; 330/311
[58] Field of Search ............... 330/151, 277, 300, 311, 330/293

[56] References Cited

U.S. PATENT DOCUMENTS

| | | | |
|---|---|---|---|
| 3,286,189 | 11/1966 | Mitchell et al. | 330/277 |
| 3,449,683 | 6/1969 | Gane | 330/277 |
| 3,449,686 | 6/1969 | Bladen | 330/277 |
| 3,723,892 | 3/1973 | Julie | 330/300 |

OTHER PUBLICATIONS

Watson, "Biasing Considerations in F.E.T. Amplifier Stages", *Electronic Engineering*, Nov. 1968, pp. 600–605.
Nienhuis, "Integrated Audio Amplifiers with High Input Impedance and Low Noise", *Philips Technical Review*, vol. 31, No. 7/8/9, pp. 245–247.

*Primary Examiner*—James B. Mullins
*Attorney, Agent, or Firm*—Blakely, Sokoloff, Taylor & Zafman

[57] ABSTRACT

Field effect transconductance amplifiers having improved linearity and noise rejection characteristics to provide an amplifier output having excellent temporal coherence with the input signal are disclosed. The amplifiers utilize a series connection of two field effect devices, actual or emulated, preferably appropriately biased in a carrier velocity limited region to maximize linearity of the output. A high level of rejection of power supply noise may be achieved by a third series field effect device. Various embodiments including high gain and power amplifier embodiments are disclosed.

39 Claims, 24 Drawing Figures

_Fig. 18_

_Fig. 20_

_Fig. 21_

FIELD EFFECT TRANSCONDUCTANCE AMPLIFIERS

BACKGROUND OF THE INVENTION

1. Field of the Invention

The present invention relates to the field of amplifiers.

2. Prior Art

Amplifiers of many diverse types are well-known in prior art. Of particular importance to the present invention, however, are amplifiers comprising one or more field effect devices as the active amplifying element and/or as load devices in amplifier circuits. As used herein, the terms field effect devices and field effect transistors are used in the most general sense to identify semiconductor devices or circuits wherein the flow of charge carriers from one region to a second region in the semiconductor device is dependent upon the voltage applied to a control gate in the device. Semiconductor devices of this type generally include junction field effect devices and surface field effect devices, the structures and characteristics of which are generally described in the book entitled "Physics and Technology of Semiconductor Devices" by A. S. Grove (John Wiley & Sons, Inc., 1967) and "MOS Field-Effect Transistors and Integrated Circuits" by Paul Richman (John Wiley & Sons, Inc., 1973). As described therein, a field effect transistor may be considered as device which utilizes an electric field to modulate the conductance of a channel through which current flows. In that regard, field effect transistors may be considered as three terminal devices, these terminals being defined as a source of carriers, a drain of carriers and a voltage controlling gate through which the field control of conductance between source and drain is implemented. (A substrate connection is also required, thereby potentially providing a four terminal device, though generally the substrate is tied to the source, thereby being transparent to the device user.) While the specific mechanics of the field control differs between the pn junction and the insulated gate field effect transistors (FETs), the concept of using voltage on the high impedance gate to modulate the conductance of the drain source channel is the commonality which defines the field effect transistor.

A fundamental amplifying parameter of the field effect transistor is its transconductance, $g_m$. This parameter is defined as the ratio of the incremental increase in drain-source current for an applied incremental increase in gate-to-source voltage:

$$g_m = \frac{\partial I_D}{\partial V_{GS}} \bigg|_{V_{DS}}$$

where $I_D$ equals the drain current, $V_{GS}$ equals the voltage on the gate with respect to the source and $V_{DS}$ is the voltage between the drain and source. The actual conductance of the drain-source channel is termed $g_o$ (output conductance), another fundamental amplifying parameter.

The prior art shows the simplest method of making a voltage amplifier to be attaching a load resistor from the power supply to the FET drain, and applying a gate voltage sufficient to bias the device to draw a nominal current through the load resistor. Modulation of the gate-to-source voltage causes changes in the device's thru-current (via transconductance) to develop an output voltage at the drain. The voltage step-up obtainable is the product of the FET transconductance with the total resistance seen at the output, a parallel combination of the load resistance and the drain-source resistance.

$$A_V = g_m \left( \frac{R_L R_{DS}}{R_L + R_{DS}} \right)$$

where $A_V$ equals voltage gain, $R_L$ equals the load resistor, $R_{DS}$ equals the resistance between the drain and source at the operating point ($1/g_o$).

The drawback to using this much-used technique is that very high voltage gains are not possible without power supply voltages which greatly exceed the drain-source voltage, as the load resistor drops voltage due to the bias current. Further, an amplifier of this type is relatively non-linear and because the amplifier is unsymmetrical; the distortion of an AC input is also unsymmetrical, giving rise not only to high-third and other odd harmonics, but also high-second and other even harmonics. Also, obviously the output is highly sensitive to power supply fluctuations.

To achieve high voltage gains, the prior art shows utilization of another field effect transistor biased in saturation and used as a load resistor (the first field effect transistor also being operated in saturation). The additional device is connected drain-to-power supply, source-to-lower device drain, with a capacitor between the gate and source terminals to provide an AC short therebetween. A resistor divider from the power supply sets the upper gate voltage while the lower device bias sets the current flowing through both devices. Since the upper device source 'floats', the gate-source bias conditions for the determined current automatically sets for similar FETs.

At frequencies which the capacitor appears as a short, the upper FET acts as a load resistor $R_{DS} = 1/g_o$ since the gate-to-source voltage for the AC will be zero and no transconductance action can occur. The DC bias conditions (drain-source current and voltage) determine the magnitude of the drain-source resistances of the FETs (both biased in saturation). If the upper and lower FETs are identical, then the voltage gain is:

$$A_V = g_m/2g_o = \frac{g_m R_{DS}}{2} = \partial V_{DS}/\partial V_{GS} (AC)$$

Since high drain-source resistances are possible with FETs in saturation at modest drain-source voltages, high voltage gains are possible with AC and nominal power supply voltages.

However, unlike simple resistors, the field effect load resistance varies with the voltage applied across it. Since it is the field effect which manifests this resistance, variations in field across the drain-source channel alters the conductance as well as variations in the gate-source voltage (although the magnitudes differ considerably). This voltage-variable resistance characteristic of the FET load resistor is a drawback to its use in linear amplifiers.

The voltage gain of the dual FET AC amplifier is dependent upon the magnitude of the drain-source conductance. Therefore, voltage modulations across either FET will modulate the voltage gain.

The drain-source conductances are modulated by the output voltage at the center drain-source node (both upper and lower FET drain-source channels). Also, the upper FET load resistor is modulated by variations (noise) in the power supply voltage, and voltages due to current noise in the drain-source channel.

The voltage gain of the amplifier may be represented as a function of the input and output voltages in some polynominal fashion, the terms of the polynomial, other than the linear term, describing the nonlinearity. The function is not important; the relation between the input and output is coherent (although distorted). Whereas the output may not exactly replicate the input (distorted), because the voltage gain is coherent the form of the output is always predictable. Because of this property, the input signal and feedback techniques can reduce the distortion in the output due to the modulation of the FET characteristics by both the input and output.

However, if the voltage gain is modulated by the power supply noise through the drain-source conductance dependency with voltage, or by internally generated noise in the channel, the voltage gain then has noise-dependent terms in its magnitude; it becomes incoherent. Because the 'noise dependence' in the gain reduces the predictability of the output form, feedback techniques have reduced effectiveness. In that regard, the fundamental requirement of any amplifier is to increase the magnitude of its input without distortion of any kind. All amplifying devices generate noise and amplify with characteristics which are dependent to some extent upon bias and signal currents and voltages (e.g. nonlinear). The interaction of the amplification nonlinearity with the circuit noise creates an intermodulation of the amplification characteristic, and hence the output, with noise. This noise intermodulation phenomenon therefore converts some of the output information into noise. Another way of saying this is that the input signal correlation with the output is not perfect because the output signal was made partially incoherent due to the noise intermodulation phenomenon. Since noise is incoherent by definition, noise intermodulation reduces the temporal coherence of the amplification process (and thereby reduces the coherence of any information passed through the amplifier). A limitation of temporal coherence on the amplifier poses a limit to the dynamic range of information which can be passed through it; there is a limitation to the information density which the amplifier can accurately recreate. Of course, this limitation reduces the effectiveness of feedback correction of coherent distortion; feedback is a linear addition process and can no way correct a loss of information due to limited amplification coherence.

The modulation of the amplifier voltage gain by noise reduces the coherence of the amplifying function. For applications of voltage amplification which have a requirement for coherence, reduction of the effects of channel and power supply noise modulation is essential. However, the prior art FET loaded AC voltage amplifier is attractive because of the high voltage gains which are possible at modest power supply voltages. If this voltage gain could be made coherent, then the large excess gain could be used with feedback to provide a very linear amplifier. In that regard, it is important to point out that there are two noise sources which intermodulate: noise within the channel (current noise) and noise across the channel due to the power supply. Nothing can be done about internal noise but power supply noise can be reduced because it is "external." Power supply noise can be reduced according to the prior art with a series power supply resistor and a shunt capacitor on the drain of the load FET. The rejection in this case is determined by the time constant of the capacitor with the parallel combination of the series resistor and the drain-source resistance. To achieve high rejection, either the resistor must be very large (high voltage drop) or the capacitor very large (impractical at lower frequencies), even for modest power outputs.

BRIEF SUMMARY OF THE INVENTION

Field Effect Transconductance Amplifiers having improved linearity and noise rejection characteristics to provide an amplifier output having excellent temporal coherence with the input signal are disclosed. The amplifiers utilize a series connection of two field effect devices, actual or emulated, preferably appropriately biased in a carrier velocity limited region to maximize linearity of the output. A high level of rejection of power supply noise may be achieved by a third series field effect device. Various embodiments including high gain and power amplifier embodiments are disclosed.

DETAILED DESCRIPTION OF THE INVENTION

Figure 1:
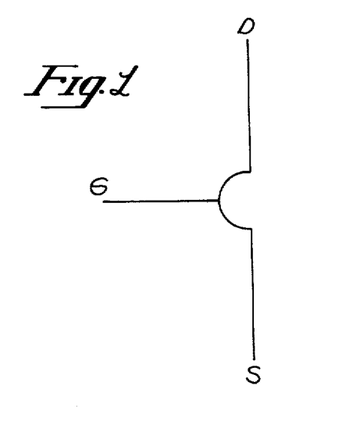
FIG. 1 presents the symbol used in the remainder of the figures for field effect devices in general, either actual or emulated.

In the descriptions of the various aspects of the present invention to follow herein, it will be noted that the invention can be realized with any of a wide variety of field effect devices including n-channel and p-channel, junction and surface field effect devices, and even by the use of multiple devices interconnected so as to behave as field effect devices, whether realized in discrete or integrated form. Thus, in order to illustrate certain aspects of the present invention in a general manner, a specific symbol is adopted in the disclosure to follow to represent a field effect device, actual or emulated, with actual illustrative types or realizations of the more general field effect device being subsequently given. The specific symbol used is shown in FIG. 1 with the source drain and gate being identified by S, D and G respectively. Where specificity between multiple devices coupled in circuit is required, either in the drawings or in equations comprising part of the description of the invention, the devices will be individually numbered 1, 2, 3, etc., those postscripts being used when required to identify the specific voltages, parameters, etc. for individual devices in circuit.

It will be noted that the symbol of FIG. 1 is for a three terminal device. As previously mentioned, field effect transistors, whether junction or surface field effect, have a fourth electrical state which must be determined, specifically the substrate voltage. In particular, such transistors require that the substrate be biased so that the pn junctions formed with the substrate be back biased. In discrete devices this may be readily achieved by connecting the substrate to the source for both n-channel and p-channel devices. It is to be understood however, that this is not a requirement, but that the description of the various aspects of the present invention with respect to a three terminal device is for purposes of clarity only, and not by way of limitation. As one specific example, the present invention generally uses either two or three field effect devices connected in series so that when realized in intergrated form, all sources cannot be directly coupled to the substrate. However, substrate biasing techniques for this general type of circuitry are well-known in the prior art and accordingly need not be described herein.

Figure 2:
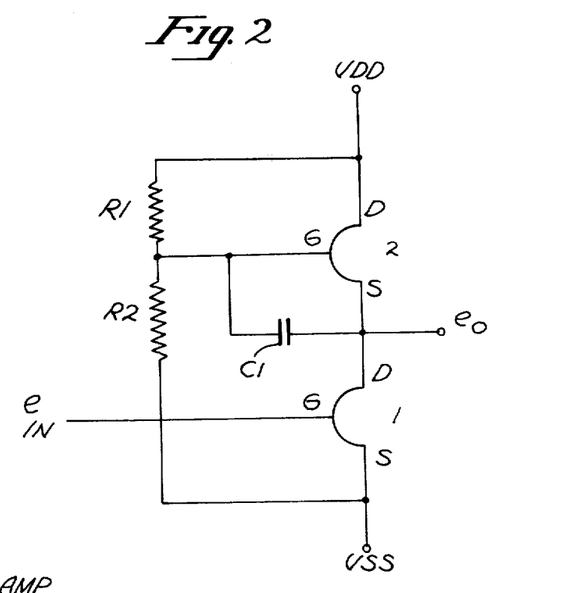
FIG. 2 is a schematic diagram of a two field effect device amplifier.

Now referring to FIG. 2, a field effect device amplifier circuit utilizing two field effect devices coupled in series may be seen. For reference, the source of FET-1 is coupled to one power supply connection VSS, with the drain of FET-1 being coupled to the source of FET-2. The drain of FET-2 is coupled to the other power supply terminal VDD (positive for n-channel devices and negative for p-channel devices). The bias for the gate of FET 2 is set by resistors R1 and R2, with an AC short being provided between the gate and source of FET-2 by capacitor C1. The input is provided to the gate of FET-1 with the output being taken from the common connection between the drain of FET-1 and the source of FET-2.

The circuit of FIG. 2 can be found in the prior art, and is intended to be operated with the field effect devices in saturation, also referred to as the region of saturated current flow. In particular, the three terminal electrical characteristics of field effect devices can be divided into three regions. At values of applied drain voltage which are sufficiently small to be very much less than the magnitude of the gate voltage minus the threshold voltage, the drain current at constant gate voltage is found to increase linearly with increasing drain voltage. This region is frequently referred to as the variable resistance region for such devices. As the applied drain to source voltage is increased and becomes larger than the gate voltage minus the threshold voltage, the drain current tends to saturate and becomes relatively constant and independent of the drain voltage. The saturation of the drain current is a direct result of the formation of a depletion region near the drain end of the conducting channel. When the device is operating under these conditions, it is said to be operating in the region of saturated current flow or simply saturation. (In this region, the drain current is approximately proportional to the square of the gate voltage minus the threshold voltage). Finally at very large values of applied drain voltage avalanche breakdown of the drain diode occurs and the drain current begins to increase extremely rapidly with increasing drain voltage. Thus, the prior art operation of the amplifier shown in FIG. 2 is in saturation, i.e. the saturated current region. The gain of an amplifier of this type for frequencies wherein the capacitor C1 acts as an AC short is $A_V = g_m/2g_o$. Wherein, $$g_m = \frac{\partial I_D}{\partial V_{GS}}\bigg|_{V_{DS}} = \text{transconductance}$$

$$g_o = \frac{\partial I_D}{\partial V_D}\bigg|_{V_{GS}} = \text{output conductance}$$

The voltage gain figure of merit for a field effect transconductance is the ratio of the transconductance $g_m$ to the output conductance $g_o$. This parameter measures the degree of impedance transformation from the source to the drain. The ability of the FET to provide an active impedance transformation allows the device to exhibit a power gain, the greater the ratio the larger the power gain.

The power gain of a field effect transconductance may be defined $$P_i = i_D V_{GS};\ P_o = i_D V_{DS}\ \frac{P_o}{P_i} = \frac{V_{DS}}{V_{GS}} = A_V$$

Since there is no current gain within the drain-source channel, the power gain of the device may be defined as the previously described voltage gain (this of course ignores the 'infinite' current gain of the field effect injection of current into the channel). This voltage gain occurs by the transition of impedance across the drain-source channel.

Current is injected into the low impedance source which is then swept into a depletion zone by electric field drift forces. The depletion zone is a high impedance region, the value of which is determined by the current density and path length across the zone.

The voltages present at different points within the drain-source channel affect the current densities at those points via some functional; at the source end the functional (of current) is the transconductance, and at the drain end the functional (of current) is the output conductance.

If these functionals are not identical, then the impedance transformation, or voltage gain, itself becomes a functional of current and therefore nonlinear. Since the current density at any point within the drain-source channel is not perfectly predictable due to the thermal distribution of energy (noise), the resultant noise current intermodulates the voltage (or power) gain when this gain is a functional of drain current.

When the current noise intermodulates the amplifying device's gain, this is tantamount to a limitation of the temporal coherence of the amplification process; the current noise is not merely added to the output. Since noise is always present, the degree of the reduction of the temporal coherence is directly related to the strength of the functional relationship of the drain current to the voltage (or power) gain.

It is desired, therefore, to modify the prior art amplifier to exactly match the functional relationship with current of the transconductance and output conductance over the widest possible operating conditions thereby achieving a linear voltag gain with the attendant decrease of noise intermodulation in the channel.

The field effect transconductance is a well known functional derived essentially from Poisson's Equation. The output conductance functional varies somewhat with the specific device geometry through the relationship arises from the motion of the source-end of the depletion region with variations in the field across the depletion region; since the zone cannot 'pinch together' much as its depth is increased, it must spread laterally toward the source. Motions of the depletion zone by drain-source voltage variations affect the channel current, leading to an output conductance.

The inherent voltage gain of the field effect device is defined as the ratio of transconductance to output conductance. For many field effect devices the functionality of this voltage gain with drain current is $$g_m \alpha i_D^{\frac{1}{2}}; g_o \alpha i_D \rightarrow A \nu \alpha i_D^{-\frac{1}{2}}$$

though the exponent and functionality can vary somewhat with the device type, geometry, and bias conditions.

To linearize this function, a physical process must occur which counteracts this functional relationship to make it independent of current and therefore immune to intermodulation by either signal or noise currents. This physical phenomenon must of course be a nonlinear functional of current in order for linearization to occur.

The flow of current through semiconductor resistors obeys Ohm's law (is linear) for relatively low values of electric field in the resistor. However, as the electric field is increased, the functional relationship of voltage and current deviates from linearity; at sufficiently high fields, the current becomes independent of the voltage applied and therefore saturates.

The physical phenomena occurring is a limitation of the carrier velocities in the semiconductor channel; as the fields are increased, the carrier drift velocity approaches the thermal velocity which it cannot exceed. (Groove, p 108)

If the drain-source depletion zone is biased with an electric field to partially limit the carrier velocity in the zone, the resistance relationship of carrier flow within the zone will be nonlinear and will change the functional relationship of the output conductance.

The compensating nonlinearity is therefore adjusted by the drain-source voltage bias across the device for a particular current flowing.

Whatever the specific functional relationships are, there will be a region between the onset of carrier velocity limitation and full limitation which will provide a nonlinear resistance characteristic which is used to compensate the nonlinear voltage gain functional at normally-used bias conditions.

Theoretically, there is only one bias point of drain-source voltage and current which provides exact linearization of the voltage gain. Variations of the drain-source voltage modify the electric field across the depletion zone, hence the linearizing bias point; variations in the current also modify the depth of depletion (the length of the depletion zone) thereby also modulating the electric field within the depletion zone.

For these reasons, it is not possible to completely linearize the voltage gain because the biasing conditions cannot be stable if the device is to perform its function. By adjusting the quiescent biasing conditions so that deviations about the exact linearizing point minimally affect the overall linearization, the maximum amplifier performance is obtained.

For many field effect devices with the functionality described previously, the desireable bias point will be the electric field across the depletion zone which puts the carrier velocity point approximately midway between the region of onset and full limitation; the resistance in the depletion zone will vary approximately as the square root of current to compensate the voltage gain nonlinearity. Deviations about this point will have a minimized effect upon the form of the linearizing functional.

Long drain-source channels allow a high value of signal-to-bias drain-source voltage; this geometry therefore minimizes the effect of drain-source voltage on the depletion zone electric field bias. Since long channels have a long depletion zone (the depletion zone for bias conditions not too close to pinchoff is approximately 60-80% the length of the metallurgical drain-source length), modulation of the length of the depletion zone will also be minimized.

If the output of a field effect amplifier is taken from the center of the depletion zone (as it is on the FET-load configuration with a capacitor shunt to make the depletion load resistor), then the modulation effects of the output voltage are reduced by the symmetry and push-pull action across the two halves of the depletion zone; if the electric field across one half goes up, the electric field across the other goes down thereby greatly reducing the net effect of the electric field variations upon the entire depletion zone.

A method for deriving such a tap into the center of a depletion region consists of using two field effect transconductances serially, where the lower device is the driver and the upper device the load, as in the circuit of FIG. 2.

It is important to note that in configuration which uses two or more separate devices to emulate a single device to separately optimize the magnitudes of the transconductance and output conductance for the single emulated device, the $g_m/g_o$ biasing conditions should be met for each device separately as well as between them. There must be a functional match of all impedances in a single drain-source channel, i.e. all $g_m$'s and all $g_o$'s exhibit identical (as practical) functionality.

A special condition can be made whereby the transconductance device (driver) can be a very short channel device in which the carriers are fully velocity limited throughout its entire drain-source channel. An example of such a device is the DMOS transistor (double-diffused MOS FET), in which the effective drain-source channel length is determined by an "emitter-push" diffusion. This will require a load device operated in the same regime of full velocity limitation. In this case, it is possible to achieve both linear voltage gain and also linear transconductance. This then makes all amplifying functions independent of bias variations, the goal of perfect amplification.

Thus, in general, by providing a sufficiently high electric field within the depletion zone of the FET, partial carrier velocity limitation effects will reduce the output conductance functionality of drain current (proportional) to that of the transconductance (proportional to the square root). This carrier velocity limited region, or simply velocity limited region, is to be distinguished from the saturation hereinbefore described. In particular, the word saturation as used herein with respect to the operation of field effect devices is used in conjunction with the saturation of drain current with respect to further increases in drain voltage for a given gate voltage. Carrier velocity limitation on the other hand, or simply velocity limitation, refers to a current saturation of the drain region caused by the reduction of carrier mobilities with increasing field strength (see page 34 of "MOS Field-Effect Transistors and Intergrated Circuits" hereinbefore referred). Accordingly, in accordance with this aspect of the present invention the two devices comprising the amplifier of FIG. 2 are operated within the region of at least partial carrier velocity limitation so that the output conductance functionality of drain current may match the same functionality for the transconductance, with the proper operating point readily being found for any specific devices of the type stated by adjusting the power supply voltage and checking the linearity of the amplifier output.

Figure 3:
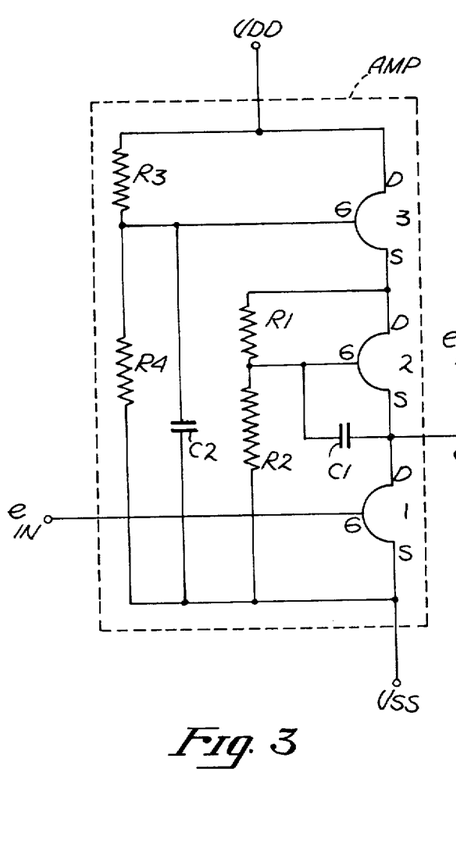
FIG. 3 is a schematic diagram of a three field effect device amplifier in accordance with one embodiment of the invention.

In accordance with another aspect of the present invention, a means is provided to significantly reduce power supply noise modulation in the amplifier circuit of FIG. 2, whether operating in the saturation region of the prior art or partial carrier velocity limiting region in accordance with the present invention. In particular, an additional field effect transistor of similar or identical characteristics is added to the drain end of the field effect load resistor serially, drain-to-source, with the drain end of the added FET attached to the power supply. This is shown in FIG. 3, with the added FET being identified by the numeral 3. Resistors R3 and R4 are also added to properly bias the gate of FET-3, with capacitor C2 being connected from the gate of FET-3 to the source of FET-1 to complete the circuit (The biasing shown is not the only biasing which may be utilized, though that shown has the advantage of decoupling the biasing of FETs-1 and -2 from power supply variations).

For frequencies where the capacitor C2 effectively eliminates all AC variations of the upper gate, the upper FET acts as a reverse-injected common gate input of the power supply to the drain of the load resistor FET. The rejection of power supply noise where the shunt capacitor C1 acts as a perfect short is given by the voltage gain of the common gate coupling stage, i.e.

rejection $= g_m/g_o = g_m R_{DS} = \partial V_{DS}/\partial V_{GS}$ (AC; gate shorted)

Large voltage variations on the high impedance drain produce small voltage variations on the low impedance source of this added FET in this ratio. Thus noise voltage at the FET load resistor is reduced at frequencies to which the upper FET gate appears shorted.

The shunt gate capacitor of the invention need only be a modest value since the gate biasing resistors can be very large, achieving a short at this gate even at low frequencies. The high drain-source resistance of a FET in saturation provides high voltage gain and high power supply noise rejection. The upper rejection FET is preferably biased in the identical manner as the lower FETs. The resistors on the gates determine the gate voltages, and the current through the FETs sets the source voltage.

Biasing of the triple-gate AC voltage amplifier is accomplished with gate resistors and the FET-1 gate-to-source voltage. Field effect transistors of all types can be used in this structure and biased in this fashion. The gate resistors, which can be very large in value due to small biasing currents (gate) required with FETs, set the two upper gate voltages. The gate-to-source voltage of the lower driver FET sets the drain current through the three FETs. Since the sources of the two upper FETs 'float', the drain current automatically establishes the source voltages (and drain voltages of the two lower devices). The gate voltages are sufficient to insure that the resulting drain-source voltage DC bias of each FET is such that it biases them at least in the saturation region to establish a high drain-source resistance, the conditions for saturation in a FET being $$|V_{DS}| \geq |V_{GS} - V_P|$$

where $V_P$ is defined as the gate-source voltage at which drain current just begins to flow (onset of turn-on). (For maximum linearity, biasing in partial carrier limiting region may also be used as previously described.) The gate-source capacitance C1 allows the operation of FET-2 as a load resistor, and the gate-ground capacitor C2 shorts the gate of FET-3 so that it may reject AC variations on its drain by the ratio of the transconductance-to-output conductance. The low level input voltage is impressed at gate-1, and the amplified voltage read at drain-1, source-2. The output voltage is inverted.

In partial summary of this aspect of the invention, power supply noise can both add to and intermodulate the amplification transfer function of the two device field effect AC voltage amplifier. Assuming the functional match of transconductance and output conductance by electric field conditions, power supply noise will certainly add to the output. However, since there is only one point which exactly linearizes the voltage gain of the amplifier, modulation of the electric field bias by noise variations of the drain-source voltage from the power supply will modulate the voltage gain by changes in the linearization bias. Of course the linearization condition reduces the modulation of voltage gain, though it will still occur and reduction of the power supply voltage on the active load device is desireable to minimize the effect.

The addition of the third field effect device of the same type and having the same bias conditions as the two active amplifying devices can perform this function in the best possible way. Aside from the high degree of noise rejection possible with the field effect device, a continuation of the current channel to the power supply with the same functional matching is the key to the optimality.

The AC shunt of the noise rejection device prevents the power supply noise on its drain from appearing on the load device's drain by a reverse impedance transformation, or a reverse voltage gain (attenuation).

The transconductance functionality of the noise rejection device should match that of the active amplifying devices, hence also the output conductance of the amplifying devices. The reason is essentially the same as that for the linearization of the voltage gain; signal and noise current flowing through the noise rejection device will create voltages at its source (which is 'floating' on the channel) which will add to the output rather than intermodulate if the functionalities match. The noise rejection device will then perform its function of reducing power supply noise without introducing undesireable side effects. If the functionalities did not match between the active and noise rejection devices, the noise generated by the rejection device as well as the residual leakage from the power supply would modulate the transition impedance functionality from the load device to the noise rejection device; resultant distortion products would appear on the load device drain and act as another input (of uncorrelated distortion).

The functionality match within the noise rejection device itself is less critical although still desireable due to second order effects. If the power supply noise intermodulated the voltage gain (attenuation parameter) of the noise rejection device itself due to a mismatch, then the source voltages created as a result of signal current flow then become noise-distorted by power supply noise. Since the source voltage of the noise rejection device acts as an amplifier input, this is undesireable.

The optimum concept of noise rejection therefore requires a third device whose characteristics reasonably or substantially match those of the active amplifying devices.

Figure 4:
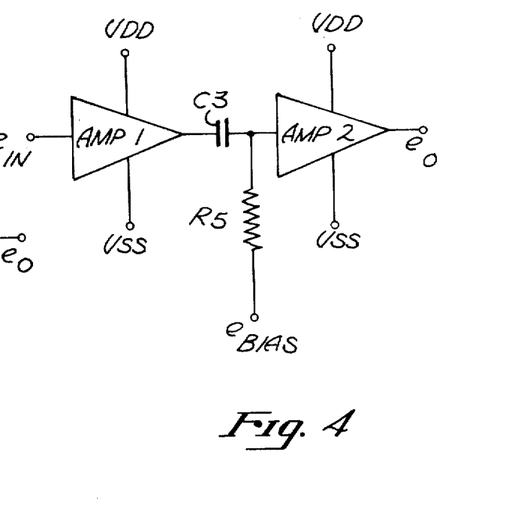
FIG. 4 is a diagram illustrating the cascading of multiple amplifiers of the present invention.

Voltage amplifiers of this type may also be cascaded as shown in FIG. 4. The output is AC coupled to the gate input of the next stage by capacitor C3 with the input to the second stage (amp −2) being biased by a separate or internally generated reference voltage. Both stages are biased in the same manner, either with separate bias circuits or by a common noise rejection capacitor, as channel occurrences do not externally interact with the gate circuit.

Figure 5:
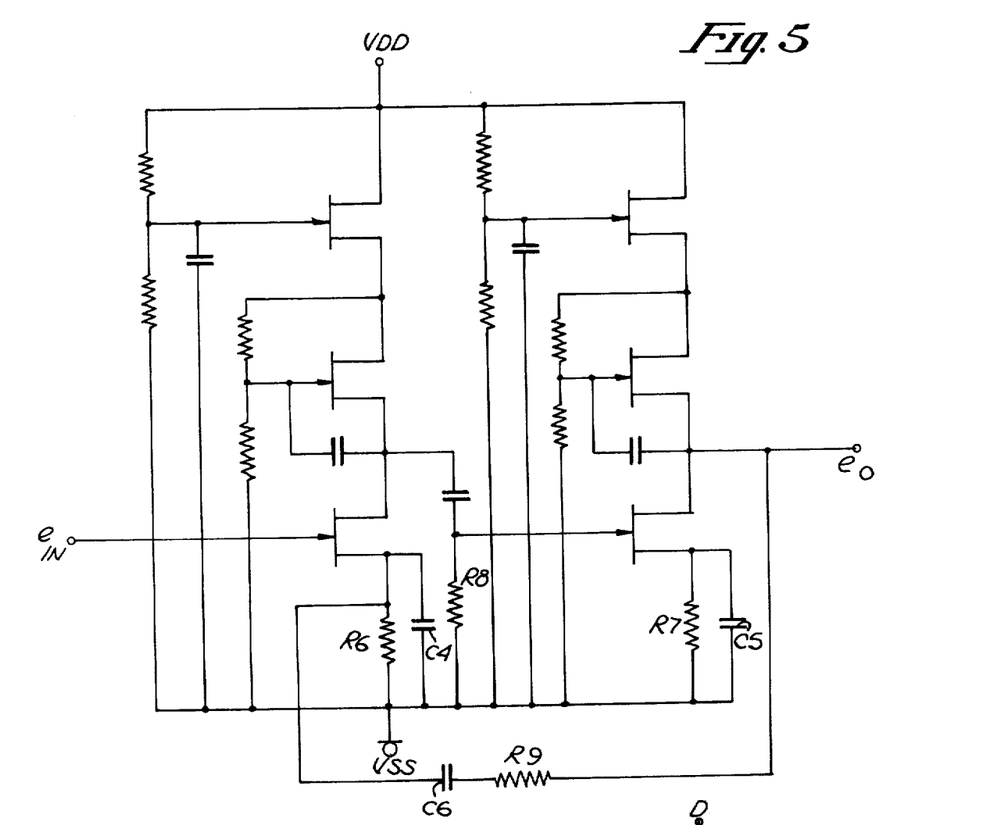
FIG. 5 is a schematic diagram illustrating a two stage amplifier having feedback.

FIG. 5 shows a typical embodiment using n-channel pn junction, depletion type field effect transistors. Since these are depletion-type FETs, source resistors R6 and R7 are used to raise the respective source voltage with the drain current to establish the required gate-to-source voltage, the gate of the second stage input being grounded through the large resistor R8. Thus the drain current will be less than the zero bias drain current in this case. Source capacitors C4 and/or C5 may be used to prevent reduction of the driver FET transconductance by the source resistor, if desired.

Since the output from two stages is not inverted, direct feedback of output to input is inappropriate for stability. However, output current may be returned through resistor R9 to the source resistor R6 on the input driver to set the closed loop voltage gain. The feedback resistor blocking capacitor C6 may not be required if the biasing of the input stage incorporates current taken from the output stage by this feedback network.

Another aspect of the invention is the recognition that a two field effect transistor amplifier such as that of FIG. 2 (or a three FET amplifier as in FIG. 3) is dependent upon the characteristics of the FETs used to achieve its performance. The voltage gain, the most important parameter, is maximized by trading off design parameters of the FETs to maximize $g_m/g_o$. For a single FET type, this maximization is limited by geometrical factors, the most important of which is the drain-source channel length. All else constant, $g_m$ is increased by decreasing the channel length, and $g_o$ is increased by increasing the channel length. For a given device design, $g_m$ and $g_o$ are traded off, as it is not possible to separately optimize these parameters in a single FET. Thus there are limitations to the gain optimization of these amplifiers according to the state-of-the-art of FET design.

Another drawback to the prior art amplifier is the 'Miller capacitance' at the input. The approximate input capacitance for this amplifier is $$C_{IN} = C_{GS} + C_{GD}(1 + A_V)$$

where $C_{GS}$ and $C_{GD}$ are the lower FET parasitic capacitances. Since the voltage gain is inverting, as the input voltage goes up, the output voltage drops, and a 'multiplication' of $C_{GD}$ occurs (the Miller effect). For large voltage gains the input capacitance is proportional to the voltage gain. This Miller effect limits the available bandwidth due to the input capacitance, and increasing the voltage gain will not improve it.

In accordance with this aspect of the invention, the two or three FET amplifiers may be improved by replacing at least some of the single FETs by a composite FET, such as a cascode connection of two or more FETs. The cascode connection, is a combination of a common source driver FET loaded into a common gate FET. The resultant combination may be considered to be a single FET, termed a cascode FET. This cascode FET then replaces the single FETs in the amplifiers, i.e. FET-1, and/or FET-2 or all three FETs.

Figure 6:
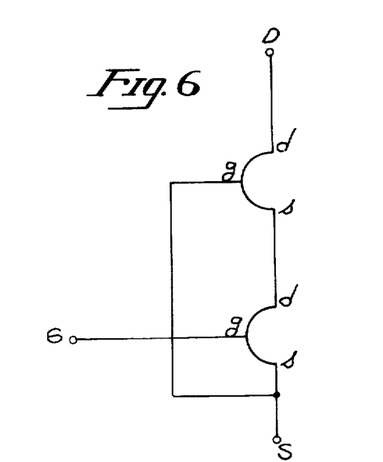
FIG. 6 is a schematic diagram of a DC cascode connection of two field effect devices.
Figure 7:
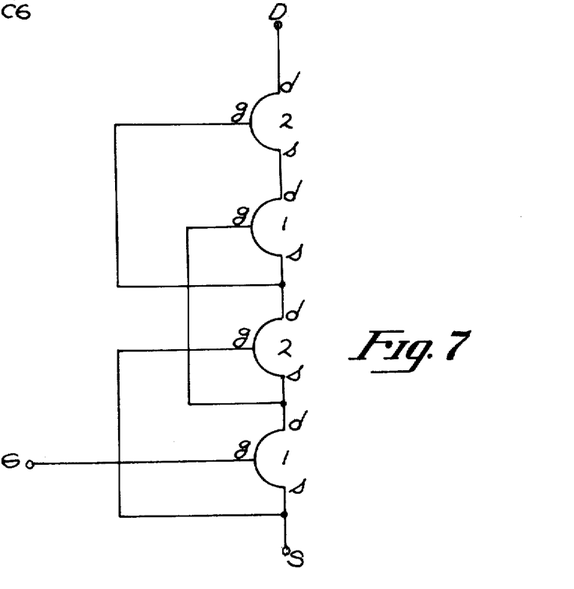
FIG. 7 is a schematic diagram of a stacked DC cascode connection of field effect devices.

There are two types of cascodes: the DC and AC cascode. The difference is the manner in which the FETs comprising the cascode FET are biased; the AC cascode works only for alternating current. FIG. 6 shows the FET connections required to make a DC cascode FET. In particular two FETs are connected with the source of the upper FET coupled to the drain of the lower FET, and with the gate of upper FET coupled to the source of the lower FET. The combination still appears as a three terminal device, having a gate connection G to the gate of the lower FET, a source S connection to the source of the lower FET, and a drain connection D to the drain of the upper FET. This principle may be extended to make a stacked cascode FET, as illustrated in FIG. 7. The cascode stack allows the use of more than two FET types to further maximize $g_m/g_o$. Shown in FIG. 7 is a DC stack, though in an analogous manner AC stacks can be made as well as level-shifted DC stacks. Biasing considerations for stacked cascodes are identical to a single cascode.

In general, the cascode FET may be comprised of any combination of types of FETs providing the combination is or may be properly biased. Also, each cascode FET may itself be connected in cascode to another single FET or cascode FET; this is termed a stacked cascode FET. (FIG. 7)

Considering the cascode FET of FIG. 6, the input is applied to the gate of the common source FET-1, with the gate-source voltage of FET-1 determining the drain current. The transconductance ($g_m$) of the cascode FET is determined therefore by FET-1. The drain connection of the cascode FET is made to the source of the common gate FET-2. The output conductance $g_o$ (or drain-source resistance $R_{DS}$) of the cascode FET is therefore that of FET-2. The figure-of-merit for the cascode FET when used in place of each FET in the AC voltage amplifier of FIG. 2, or at least in place of the lower two FETs of the amplifier of FIG. 3, $g_m/g_o$, is now separately optimizeable. In particular, FET-1 optimizes $g_m$, and FET-2 optimizes $g_o$. Since the cascode figure of merit is $g_{m-1}/g_{o-2}$, use of the cascode for the noise rejection (upper) device of FIG. 3 further improves the noise rejection capability.

The drain of FET-1 loads into the source of FET-2 which acts as the load resistance for FET-1. The voltage gain at the drain of FET-1 is approximately $$V_{V-1} = V_{DS-1}/V_{IN} = g_{m-1}/g_{m-2} (g_{m-1} >> g_{o-1})$$

In a practical application of the cascode FET as a voltage amplifier according to the invention, $$g_{m-2} >> g_{o-2}$$

The Miller effect on the input capacitance, now dependent upon the voltage gain at the drain of FET-1, is greatly reduced over that of the single FET.

$$C_{IN} = C_{GS-1} + C_{GD-1}(1 + A_{V-1})A_{V-1} \cong \frac{g_{m-1}}{g_{m-2}} << \frac{g_{m-1}}{g_{o-1}} \text{ or } \frac{g_{m-2}}{g_{o-2}}$$

To properly take advantage of the cascode FET characteristics, both (or all) FETs comprising the cascode FET should be biased at least in the saturation region. While use of the cascode FET of FIG. 6 in the invention AC amplifier would put FET-2 in the saturation region (or also in the velocity limited region), operation of FET-1 in the triode region would make the transconductance of the cascode FET equal to $g_{m-2}$ rather than $g_{m-1}$, obviating an important advantage of the cascode. However, the Miller effect input capacitance would still be diminished so that some advantage is retained.

Regardless of the FET type used in cascode structure, the requirement for saturation is approximately $$|V_{GS2}| = |V_{DS-1}| \geq |V_{GS-1} - V_{P-1}|$$

where $V_P$ (pinchoff, or threshold voltage) is the gate-source voltage required to allow the onset of current flow through the FET. The FETs chosen to comprise a cascode FET should at least allow a saturation condition for maximum effectiveness. The saturation condition leads to $$g_{m-1} >> g_{o-1} \text{ i; } g_{m-2} >> g_{o-2}$$

which then allows separate optimization of $g_{m-1}$ and $g_{o-2}$. Typically FET-1 would be a short channel device (high $g_m$) while FET-2 would be a long channel device (high $g_o$).

Figure 8:
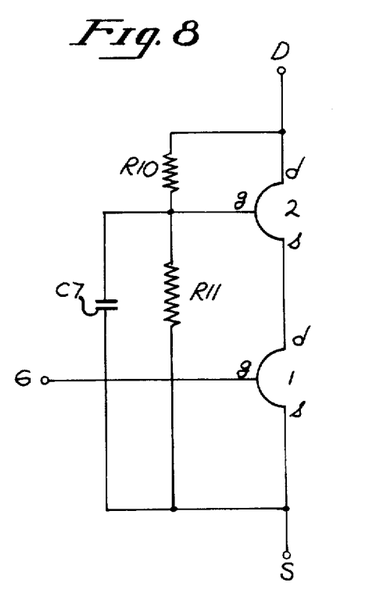
FIG. 8 is a schematic diagram of an AC cascode connection of two field effect devices.
Figure 9:
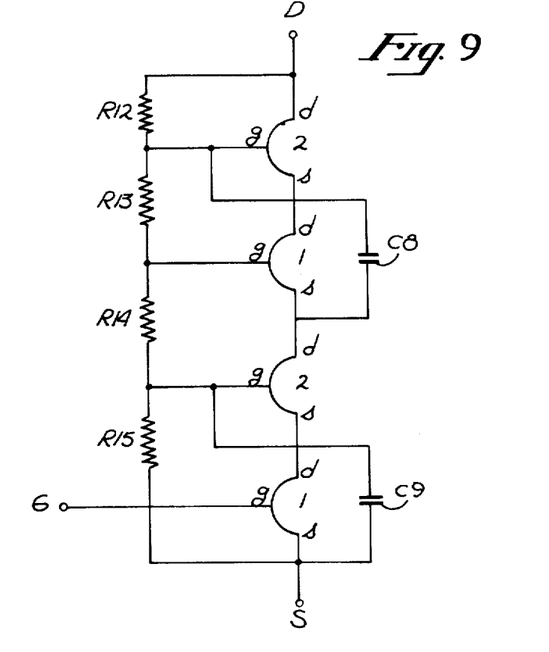
FIG. 9 is a schematic diagram of a stacked AC cascode connection of four field effect devices, FIGS. 6 through 9 showing exemplary ways field effect devices may be emulated.

FIG. 8 illustrates a typical AC cascode, and FIG. 9 a stacked cascode FET structure. The resistors (R10 and R11 in FIG. 8 and R12 through R15 in FIG. 9) insure the proper drain-source voltage bias for saturation. The gate shunt capacitors (C7 in FIG. 8 and C8 and C9 in FIG. 9) insure that the FET-2 gate is shorted to FET-1 source for AC to make the FETs act as a cascode for alternating currents. While there is a low frequency limitation of the AC cascode, there is considerable freedom in the DC biasing conditions chosen, whereas the DC cascode relies solely on the FET characteristics for bias, rather than external biasing conditions as in the AC cascode.

For the DC cascode of FIG. 6 for example, the drain-source voltage bias condition for saturation of FET-1 is equal to the gate-source voltage of FET-2. The gate-source voltage of FET-2 is automatically set by the bias drain current which is set by the gate-source voltage of FET-1 (the source of FET-2 'floats' to its bias value). For the AC cascode of FIG. 8 for example, the drain-source voltage bias for saturation of FET-1 is determined as above, except that the gate-2 potential (DC) is not equal to the source-1 potential as in the DC cascode. There is in this case a considerable relaxation of FET characteristics differences between FET-1 and FET-2 in order to bias FET-1. The penalty, of course, is that the AC cascode works as a cascode for AC only, though for many applications this may not be a handicap except, perhaps, at very low frequencies or other conditions which limit the use of capacitors.

Figure 10:
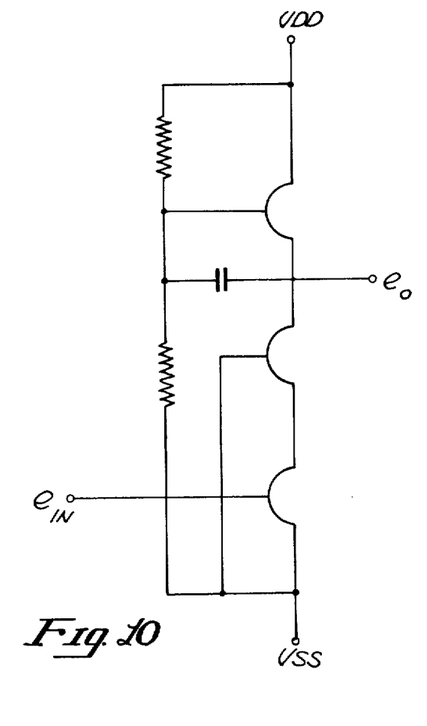
FIG. 10 is a schematic diagram of an amplifier utilizing a DC cascode connection of two field effect devices to emulate a driver device.

The use of the cascode FET in the amplifier configurations of FIG. 2 or 3, by way of example, results in a much improved AC field effect voltage amplifier. By way of specific example, FIG. 10 shows an embodiment similar to that of FIG. 2, having the DC cascode FET as the voltage amplifier driver, with a single FET as the load. Since FET-2 is optimized for $g_o$, and the load FET appears as $g_o$, this single FET load device is preferably the same or a similar type to FET-2 in the cascode FET. Biasing of the load FET is accomplished with resistors R16 and R17. The voltage gain of this embodiment is then $$A_V = \frac{V_{OUT}}{V_{IN}} = g_{m-1}/2g_{o-2} = \frac{g_{m-1}R_{DS-2}}{2}$$

Figure 11:
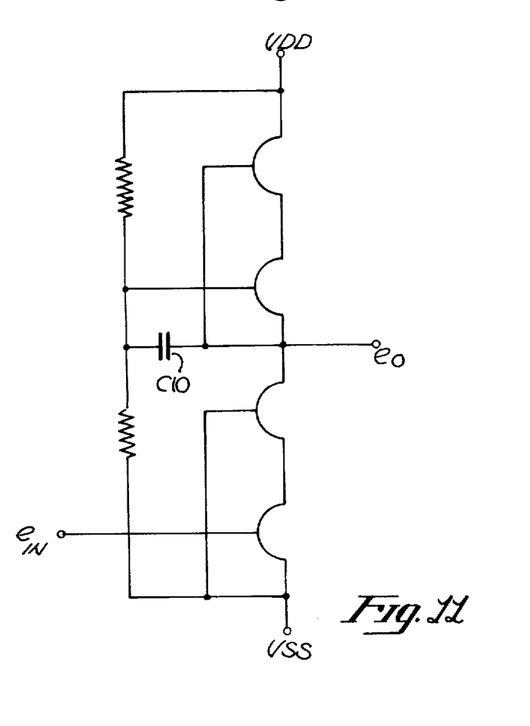
FIG. 11 is a schematic diagram of an amplifier utilizing a DC cascode connection of two field effect devices for both the driver and load devices.

FIG. 11 shows an embodiment with both the load and driver FETs replaced by the DC cascode FET. While the voltage gain is essentially the same as the embodiment of 10, since $g_{m-1} > g_{m-2}$, the gate-source voltage bias on the upper load device can be reduced by using the cascode FET as the load. This is advantageous in reducing leakage current through C10 when C10 is an electrolytic capacitor.

Figures 22, 23, 24:
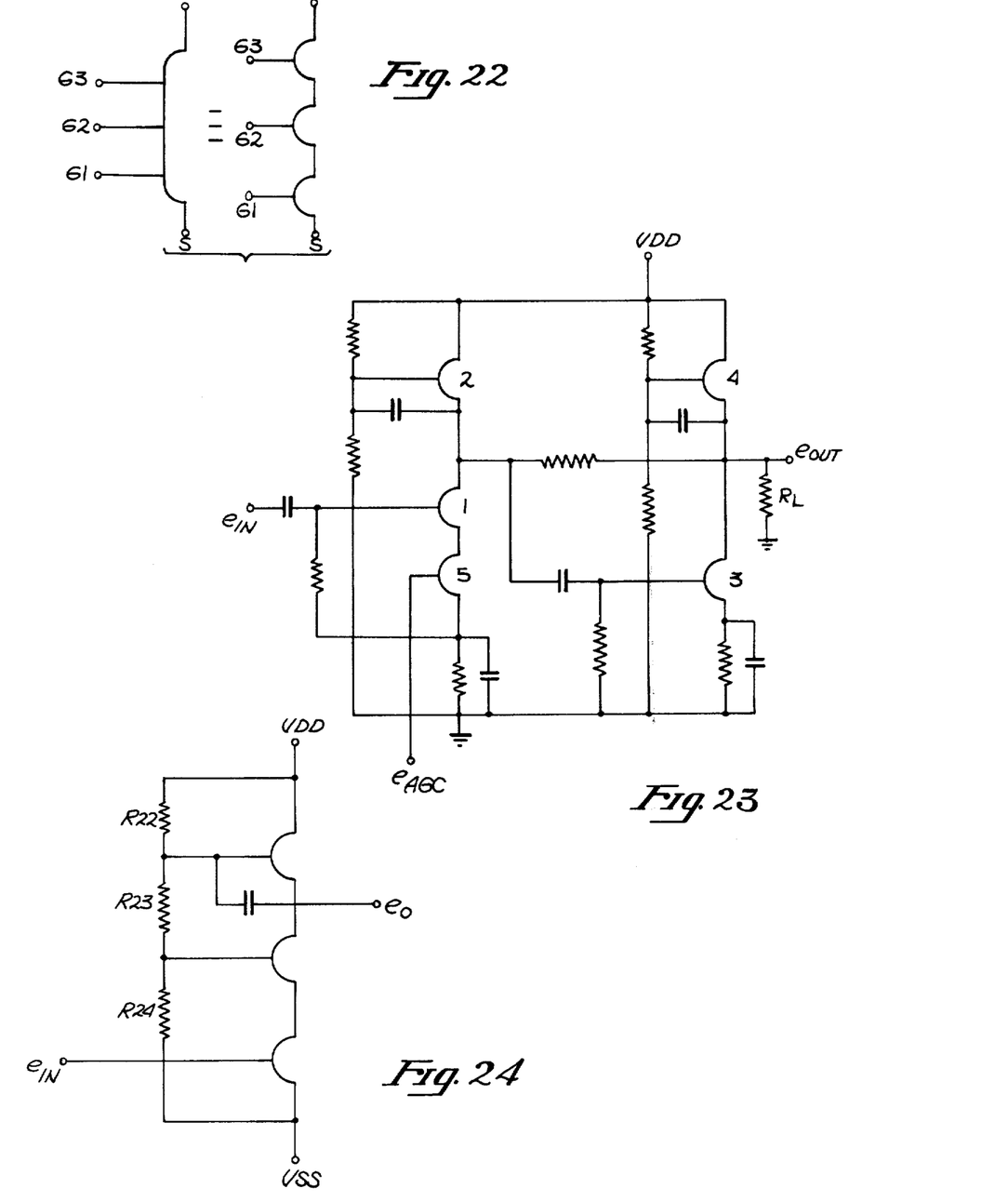
FIG. 22 shows the generalized symbols showing the equivalence of three field effect devices in series to a three gate field effect device.
FIG. 23 is a schematic diagram of a two stage amplifier having feed-forward and automatic gain control.
FIG. 24 is a schematic diagram of a two field effect device amplifier utilizing a level shifted DC cascode for the driver device.

All cascodes must be subject to providing the correct linearization fields in the depletion regions of the devices individually and in combination to equate the functionality of the transconductance and the output conductance everywhere. The simple DC cascode of FIG. 6 as a three terminal replacement for a single FET has difficulties in meeting this requirement. The two devices in the cascode must be specifically designed to 'auto-bias' to these linearization conditions. This will require a specific interlaced device design. The most difficulty arises from the driver device's drain-source voltage bias. In the simple DC cascode case, this is equal to the gate-source bias voltage of the upper device. If the gate of the upper device of a DC cascode was level-shifted to a voltage which provided the optimum drain-source bias for the lower device, the conditions could be met. This is easily done, however, with various types of resistor bias, with or without AC shunt capacitors to reduce power supply and resistor noise. (See FIG. 24, showing a two field effect device amplifier utilizing a level shifted cascode for the driver device, the biasing and level shifting being achieved by resistors R22, R23 and R24.)

Figure 12:
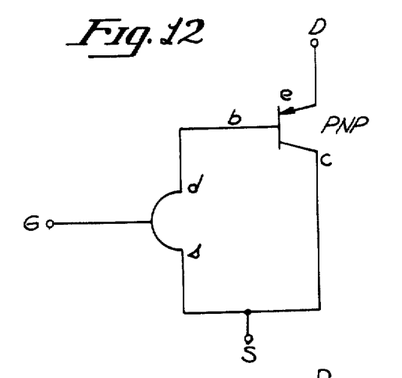
FIGS. 12 through 17 are schematic diagrams of combined field effect transistors and junction transistors coupled to emulate field effect devices.
Figure 13:
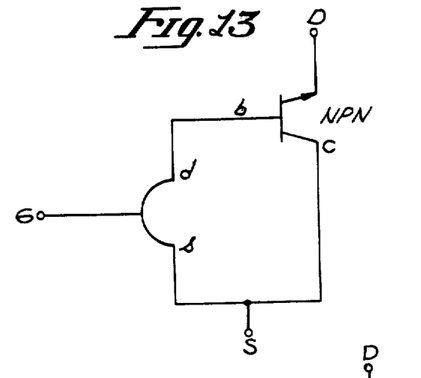
Figures 14, 15, 16, 17, 19:
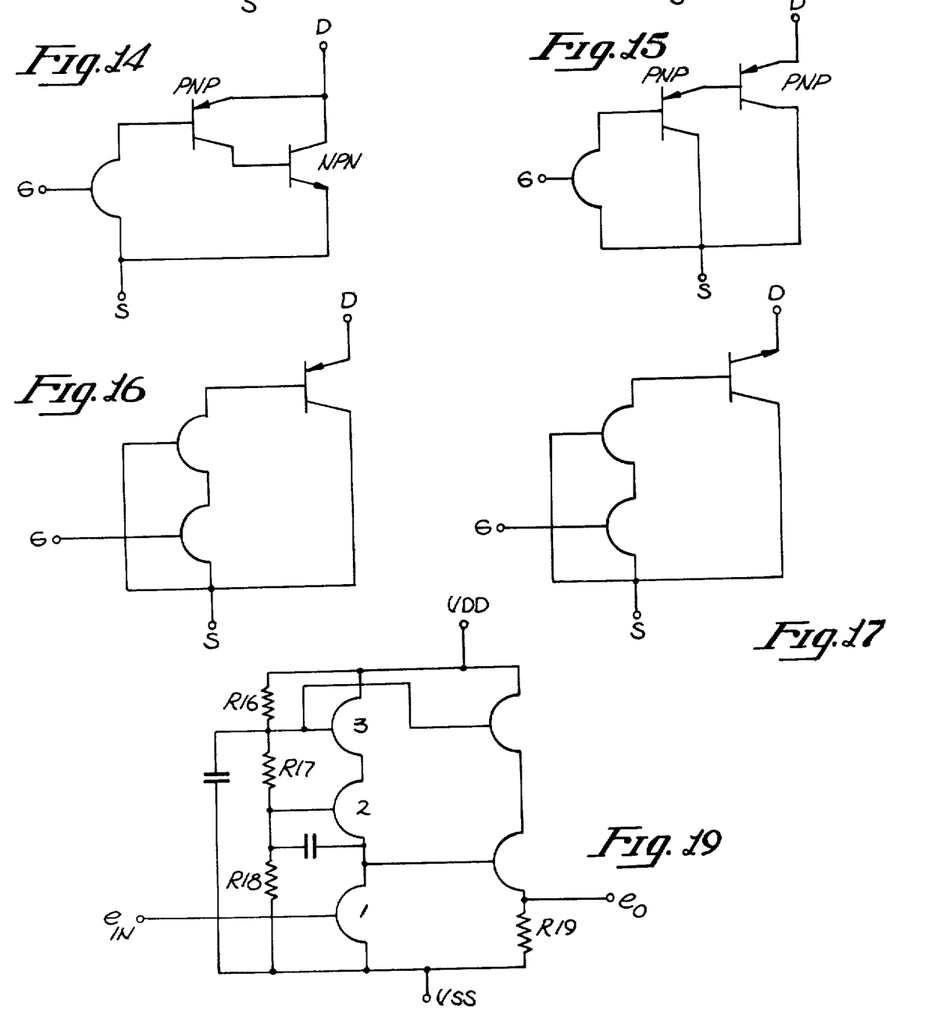
FIG. 19 is a schematic diagram of a three field effect device amplifier having an output driver stage coupled thereto.
Figure 18:
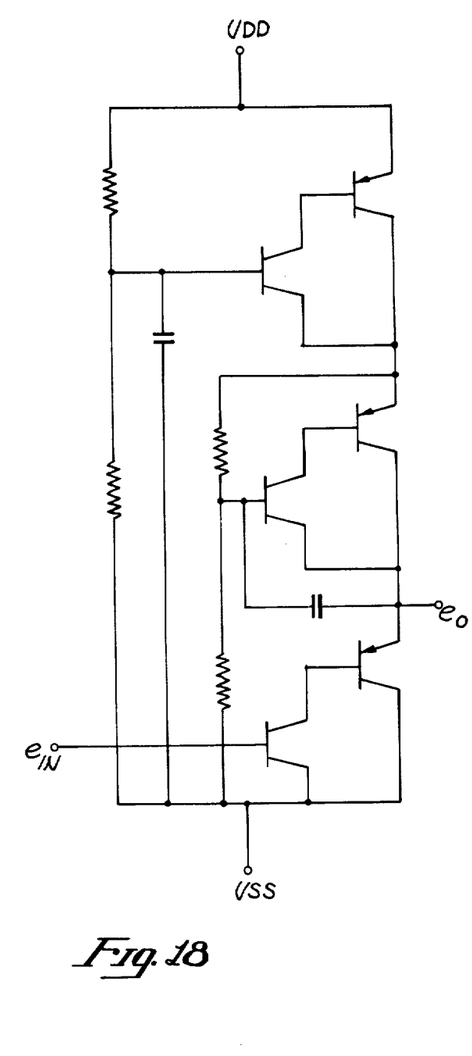
FIG. 18 is a schematic diagram of an amplifier utilizing a combination of field effect and bipolar transistors.

There has been described herein a new and unique method of biasing the prior art amplifier of FIG. 2 to provide maximum linearity in the output thereof, specifically by the biasing of the field effect devices comprising the amplifier in the partial carrier velocity limited region so that the dependence of $g_m$ and $g_o$ on drain current are equalized or at least substantially equalized at the amplifier operating point. In addition, improved amplifiers of the general type shown in FIG. 2 have also been disclosed, those amplifiers generally replacing one or both field effect transistors in the amplifier of FIG. 2 with a combination of two or more field effect transistors generally in a form of cascode connection to provide a three terminal circuit emulating the device being replaced. Finally, another improvement to the general form of amplifier shown in FIG. 2 utilizing a third series field effect device has been disclosed, FIG. 3 providing a generalized form of that amplifier including a respesentative biasing circuit. The generalized devices in the amplifiers of FIGS. 2 and 3 represented by the symbol of FIG. 1, as also used in many of the other figures herein, may be substantially any field effect transistor, such as by way of example pn junction n-channel and p-channel depletion devices and insulated gate devices in the form of n-channel and p-channel enhancement and depletion field effect devices. Where appropriate, a source resistor between the source of the driver device and VSS may be used (see FIG. 5) to establish proper biasing as desired, depending upon the device type being used. In addition the three terminal device represented in FIG. 1 as it may be used for any or all devices in the amplifier of FIG. 2 or 3 may in fact be a circuit emulating a three terminal device, such as the generalized DC cascode of FIG. 6, the AC cascode of FIG. 8 or the cascode stack of FIG. 7 by way of example. Still additional representative circuits for the emulation of the general device of FIG. 1 are presented in FIGS. 12 through 17. In FIG. 12 a field effect device represented by the general symbol of FIG. 1 is coupled to a pnp transistor as shown (base-to-drain of the field effect device, the emitter forming the equivalent of the drain connection and the collector being coupled to the source of the field effect device to form the equivalent of the three terminal device source connection). The field effect device itself may be an n-channel junction or surface field effect transistor or an emulation thereof, such as a cascode connection of field effect devices as shown in FIG. 16. In FIG. 13 the same general type of connection is shown as in FIG. 12 though utilizing an npn transistor, this circuit being formed using a p-channel junction or surface field effect transistor or emulation thereof, such as a cascode connection of p-channel devices as shown in FIG. 17. In FIG. 14 the circuit of FIG. 12 is further expanded by the provision of an additional npn transistor to control greater currents with the same FET current, whereas the same result is achieved in the circuit of FIG. 15 by adding an additional pnp transistor to provide a Darlington connection for higher bipolar current gain. An amplifier of the general type shown in FIG. 3, replacing the generalized field effect devices therein with the emulation of the field effect device of FIG. 12, is shown in FIG. 18. By the addition of the bipolar transistors both $g_m$ and $g_o$ of the n-channel field effect devices are effectively increased by the beta of the transistors. That is, $$g_m(\text{composite}) = g_m(FET) \times \text{beta (bipolar)}$$

$$g_o(\text{composite}) = g_o(FET) \times \text{beta (bipolar)}$$

The voltage gain, however, being proportional to the ratio of the effective $g_m$ and $g_o$, remains substantially unaffected. Finally, an alternate method of obtaining a high transconductance for an amplifier in accordance with the present invention may be seen in FIG. 19. In this circuit field effect devices 1, 2 and 3 are connected in series as in the amplifier of FIG. 3, though the circuits determining the reference voltage for the gate of field effect device 3 (R3, R4 and C2 in FIG. 3) have been combined with the circuit determining the bias of the gate of field effect device 2 (resistors R1 and R2 in FIG. 3) so that the overall biasing is achieved in FIG. 19 by the combination of resistors R16, R17, R18 and C11. A low output impedance of this amplifier is achieved by an additional output stage comprised of field effect devices 4 and 5, field effect device 5 having its gate coupled to the same reference as the gate of field effect 3 to minimize the influence of any power supply noise. Field effect device 4 on the other hand, has its gate coupled to the output between field effect devices 1 and 2, with the output of the output stage being taken between the source of field effect device 4 and resistor R19. Thus in this case the output stage will be noninverting, having a gain of approximately one and a relatively low output impedance (Zout ≈ 1/$g_m$). Of course, for any of the amplifiers described feedback will generally be used to both further enhance linearity and to limit and control gain, though general feedback techniques are well known and need not be further described herein.

In the foregoing explanations, it has been pointed out that one important aspect of the present invention is the biasing of the prior art two FET amplifier, preferably using devices having the same characteristics, so that the dependence of $g_m$ and $g_o$ of both devices on the drain current are substantially material, so that the open loop gain $A_V = -(g_m/2g_o)$ is substantially independent of drain current. In this manner the linearity of the amplifier is maximized. This also minimizes the effects of power supply noise as it minimizes gain variations due to drain current variations from power supply noise, which in turn minimizes the intermodulation of the amplified input signal and power supply noise, leaving power supply noise an additive rather than multiplicative component in the output (raising the possibility of reduction in the power supply noise component in the amplifier by feedback techniques). Addition of a third series field effect device with the gate-to-source having an AC shunt further reduces the effect of power supply variations by the ratio $g_m/g_o$ for the third field effect device. By also biasing the third device so that its $g_m/g_o$ is substantially independent of its drain current, power supply noise is reduced as stated while preserving the linearity of the rejection device and its interface to the load device, so that the rejection is achieved without the introduction of another possible source of intermodulation, thereby maintaining maximum temporal coherence and linearity in the amplifier output. This may be achieved by using three similar field effect devices in series with the appropriate similar biasing.

When it is not possible to design and build a FET device from the beginning to meet the specifications desired for the invention field effect amplifier, available devices can be interconnected to emulate the device to be built. Serial connection of devices, drain-to-source, with the gates connected together will emulate an FET with a longer drain-source channel. Parallel connection of devices, drain-to-drain, source-to-source, with the gates connected together will emulate an FET with a larger channel width. However, either parallel or serial connections of the same device must be made with devices of quite similar characteristics so that current (parallel) or voltage (series) shares properly between the devices.

Serial emulations will increase the output conductance, although the $g_m/g_o$ ratio will remain the same as the single device (approximately). The serial combination will allow greater voltage excursions about the optimum bias than a single device. Parallel emulations will increase the transconductance, although the $g_m/g_o$ ratio will also remain approximately the same as the single device. The parallel combination allows greater excursions of the current about its bias value than the single device. Series-parallel interconnections provide the benefit of both types of interconnections; the device size increases with the corresponding increase of transconductance and output conductance to increase the performance parameter $g_m/g_o$.

It should be noted that applications may require output voltage excursions which may be close to, or exceed the drain-source voltage bias for existing devices. Also, for critical applications, modulation of the linearization fields must be reduced and this requires maximizing the ratio of signal-to-bias fields across the devices. This may be accomplished by stacking multiple drain-source channels in series and biased to share the voltage swing between them. Of course, the impedance transition linearization requirements must be met for all of these devices, and this implies that they are all essentially the same type device and biased with the same conditions.

Figure 20:
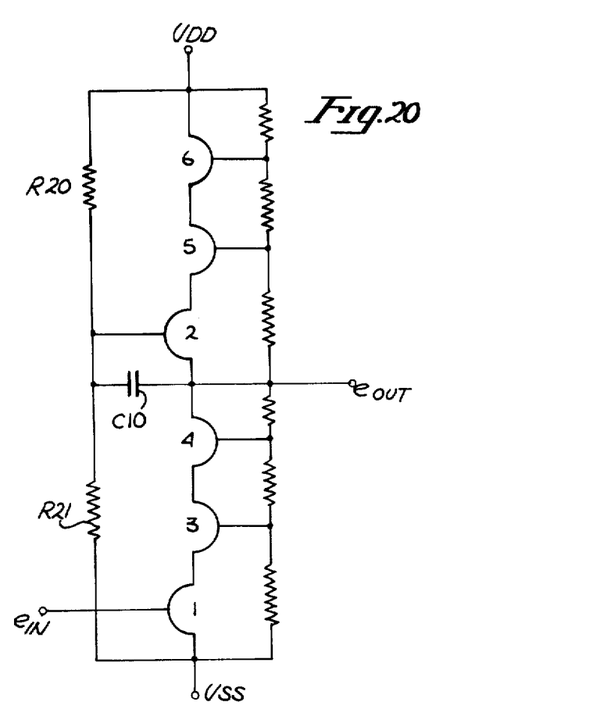
FIGS. 20 and 21 are schematic diagrams of amplifiers utilizing stacked field effect devices.

FIG. 20 shows an example of such a stack. In this figure field effect devices 1 and 2, together with resistors R20 and R21 and capacitor C10 comprise the driver and the load devices. Though the channels of the additional devices 3 and 6 are in series with the channels of devices 1 and 2, the ratio of $g_m/g_o$ remains approximately the same for the amplifier without them (for large ratios). Also in spite of the many impedance transitions (source-to-drain), functionality match (with partial carrier velocity limitation) prevents any degradation due to modulation effects.

Figure 21:
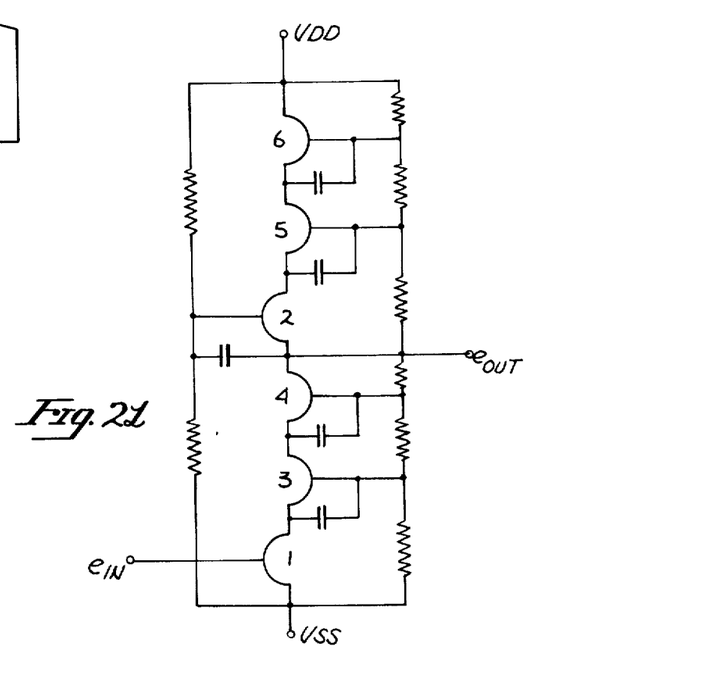

FIG. 21 shows the same stack except that the stacking channels of devices 3 through 6 are all operated as resistors by AC shunting of the respective gates to the sources. The advantage in this case is that the ratio of $g_m/g_o$ is increased by the increase of output resistances added in series.

Also it should be noted that two or more field effect transistors in serial (a single channel of current flow) comprise a multiple-gate field effect transistor. The transconductance of this device is the serial combination of the many transconductances associated with the many gates, an example shown in FIG. 1. Combination of conductances in series leads to a multiplicative relationship between them:

$$g_m = \frac{1}{1/g_{m1} + 1/g_{m2} + 1/g_{m3} + \cdots}$$

This implies a multiplicative relationship between the voltage inputs to the gates transformed into the current which flows through the channel.

Multiple-gate transconductances can be used with the invention amplifier to multiply various inputs together, this resultant being amplified. In general, the gate-source biases chosen will determine the multiplicative ratios of the inputs depending upon the relative transconductance of each 'independent' transistor comprising the multiple-gate device.

A typical use of this technique is for gain control. One of the gates is used for the signal input, the other used to control the transconductance of the driver device (which changes the gain). An example of an amplifier of this type, using depletion mode devices in an AC coupled cascode amplifier may be seen in FIG. 23. In this figure, devices 1 and 2, and 3 and 4 are the driver and load devices, respectively, for the first and second stages, respectively, with coupling between stages being provided by resistor R22 and capacitor C11. The drain end of device 5 is not depleted (not in saturation). Inputs to the gain-control gate, of course, are 'DC' to prevent any intermodulation. With this connection the effective transconductance of the input stage driver is $$g_m \, eff = \frac{1}{1/g_{m1} + 1/g_{m5}}$$

Also shown in FIG. 23 is a provision for current feed-forward, through specifically resistor $R_F$. (A disadvantage of convential feedback is the return of distortion products to the input where they are intermodulated with the input at the first stage.) Through resistor $R_F$, current from the first stage is fed forward to the second stage while voltage is fed back around the second stage. The gain of this type of configuration is calculated in the manner analogous to the Miller effect on the second stage.

$$A_{V1} \approx g_m \, eff R_F/(1+A_{V2}); A_{V2} g_{m2} R_F \| R_L$$

$$A_{Vo} \approx g_m \, eff R_F A_{V2}/(1+A_{V2})$$

$$A_{Vo} \approx g_m \, eff R_F A_{V2} >> 1 (A_{V2} = \text{second stage gain})$$

The voltage swing of the first stage is kept at the lowest possible value, determined by the voltage gain of the second stage. This minimizes the distortion of the first stage. Also the channel-to-channel coupling prevents intermixing the distortion products of the two stages. Since the bias voltages of both stages are usually the same, no AC coupling is required and there is additional stabilization of the DC bias between the two stages. Except for the excess current the output stage must provide to an external load ($R_L$), the currents flowing through the stages are equal but opposite in phase. This provides a push-pull cancellation of even harmonics of the transconductance characteristic of the FET devices used for the feedforward current. This improves the overall reduction of distortion of the output by the nonlinear transconductance characteristic (coherent distortion).

For a properly linearized amplifier, the magnitude of the effective transconductance $g_{m\,eff}$ may change but the inherent voltage gain of the amplifier will not ($g_o$ tracks $g_m$). Since the transconductance is a multiplicative parameter in an amplifier system gain, then this gain can be controlled with the multiplegate device. Obviously adjustment of the gain in this manner has a direct effect on the bias current in the first stage so that optimum bias (partially carrier velocity limited) of devices 1 and 2 (FIG. 23) cannot be precisely maintained. However, in general, $g_m/g_o$ remains relatively independent of drain current for reasonable variations around the optimum so that a reasonable AGC capability may be achieved in this manner without substantially detracting from the invented biasing principles (First stage signal amplitudes are generally relatively low anyway, so that intermodulation opportunities are minimized even if the first stage $g_m/g_o$ has a little current dependence.)

Thus, there has been described herein various aspects and exemplary embodiments of the present invention which embodiments have been presented as representative and not by way of limitation. Accordingly, it will be obvious to those skilled in the art that various changes in form and detail may be made therein without departing from the spirit and scope of the invention.

I claim:

1. A field effect device amplifier comprising first and second field effect devices each having source, drain and gate connections, said gate of said first field effect device being coupled to the amplifier input, said drain of said first field effect device being coupled to said source of said second field effect device and to the amplifier output, said amplifier also having means for substantially shorting said gate of said second field effect device to its said source for the intended operating frequency range of said amplifier, said field effect devices being biased to operate in a partial carrier velocity limited region, selected to provide a dependence of the output conductance of said field effect devices on drain current which approximates that of the transconductance of said field effect devices.

2. The amplifier of claim 1 wherein said means for substantially shorting said gate of said second field effect device to its said source comprises a capacitor.

3. The amplifier of claim 1 further comprised of means coupled between said drain of said second field effect device and said source of said first field effect device for setting the bias to said gate of said second field effect device.

4. The amplifier of claim 1 wherein said first field effect device comprises first and second field effect transistors coupled to form said first field effect device, each said field effect transistor having a gate, a drain and a source, said gate of said first field effect transistor forming said gate of said first field effect device, said source of said first field effect transistor and said gate of said second field effect transistor being coupled together to form said source of said first field effect device, and said drain of said second field effect transistor forming said drain of said first field effect device.

5. The amplifier of claim 4 wherein said second field effect device comprises third and fourth field effect transistors coupled to form said second field effect device, each said field effect transistor having a gate, a drain and a source, said gate of said third field effect transistor forming said gate of said second field effect device, said source of said third field effect transistor and said gate of said fourth field effect transistor being coupled together to form said source of said second field effect device, and said drain of said fourth field effect transistor forming said drain of said second field effect device.

6. The amplifier of claim 1 wherein at least one of said first and second field effect devices comprises a cascode connection of field effect transistors.

7. The amplifier of claim 6 wherein said cascode connection of field effect transistors comprises an AC cascode connection.

8. The amplifier of claim 6 wherein said cascode connection of field effect transistors comprises a DC cascode connection.

9. The amplifier of claim 6 wherein said cascode connection of field effect transistors comprises at least said first field effect device.

10. The amplifier of claim 1 wherein at least one of said first and second field effect devices comprises a stacked cascode connection of field effect transistors.

11. The amplifier of claim 10 wherein said stacked cascode comprises an AC stacked cascode.

12. The amplifier of claim 10 wherein said stacked cascode comprises a DC stacked cascode.

13. The amplifier of claim 10 wherein said stacked cascode connection of field effect transistors comprises at least said first field effect device.

14. The amplifier of claim 1 further comprised of at least third and fourth field devices, each having source, gate and drain connections, said first field effect device being coupled to said source of said third field effect device, said drain of said third field effect device being coupled to said source of said second field effect device and to the amplifier output, whereby said drain of said first field effect device is coupled to said source of said second field effect device through said third field effect device, said fourth field effect device having its source coupled to said drain of said second field effect device.

15. The amplifier of claim 14 wherein said third and fourth field effect devices also operate in a partial carrier velocity limited region, whereby the dependence of their output conductance on drain current is reduced to approximate that of their transconductance.

16. The amplifier of claim 15 further comprised of means for biasing said gates of said third and fourth field effect devices.

17. The amplifier of claim 15 wherein each of said third and fourth field effect devices has its said gate substantially shorted to its said source for the interested operating frequency range of said amplifier.

18. The amplifier of claim 1 further including gain control means comprised of means of controllably varying the drain current in said first and second field effect devices around the approximate value of drain current at which the dependence of the output conductance of said field effect devices on drain current is reduced to approximate that the transconductance of said field effect devices.

19. The amplifier of claim 1 wherein at least one of said field effect devices comprises a connection of field effect and bipolar transistors emulating a field effect device.

20. The amplifier of claim 19 wherein each of said field effect devices comprise a connection of field effect and bipolar transistors emulating the respective field effect.

21. A two stage field effect device amplifier comprising first, second, third and fourth field effect devices each having source, drain and gate connections, said gate of said first field effect device being coupled to the amplifier input, said drain of said first field effect device being coupled to said source of said second field effect device, said amplifier also having means for substantially shorting said gate of said second field effect device to its said source for the intended operating frequency range of said amplifier, said first and second field field effect devices being biased to operate in a partial carrier velocity limited region, whereby the dependence of the output conductance of said first and second field effect devices on drain current is reduced to approximate that of the transconductance of said field effect devices, said gate of said third field effect device being capacitively coupled to said drain of said first field effect device, said drain of said third field effect device being coupled to said source of said fourth field effect device and to the amplifier output, said amplifier also having means for substantially shorting said gate of said fourth field effect device to its said source for the intended operating frequency range of said amplifier, said third and fourth field effect devices being biased to operate in a partial carrier velocity limited region, whereby the dependence of the output conductance of said field effect devices on drain current is reduced to approximate that of the transconductance of said field effect devices, said drain of said first and said third field effect devices being coupled together through resistive means to provide feed-forward between stages.

22. A field effect device amplifier comprising first, second and third field effect devices each having source, drain and gate connections, said gate of said first field effect device being coupled to the amplifier input, said drain of said first field effect device being coupled to said source of said second field effect device and to the amplifier output, said amplifier also having means for substantially shorting said gate of said second field effect device to its said source for the intended operating frequency range of said amplifier, said source of said third field effect device being coupled to said drain of said second field effect device, said gate of said third field effect device being capacitively coupled to said source of said first field effect device, said source of said first field effect device and said drain of said third field effect device each being coupled to one power supply connection.

23. The device of claim 22 wherein said first and second field effect devices are biased to operate in a partial carrier velocity limited region, whereby the dependence of the output conductance of said first and second field effect devices on drain current is reduced to approximate that of the transconductance of said field effect devices.

24. The device of claim 23 wherein said third field effect device is also biased to operate in a partial carrier velocity limited region, whereby the dependence of the output conductance of said third field effect device on drain current is reduced to approximate that of the transconductance of said field effect devices.

25. The amplifier of claim 22 wherein said means for substantially shorting said gate of said second field effect device to its said source comprises a capacitor.

26. The amplifier of claim 22 further comprised of means coupled between said drain of said second field effect device and said source of said first field effect device for setting the bias to said gate of said second field effect device.

27. The amplifier of claim 26 further comprised of means coupled between said source of said first field effect device and said drain of said third field effect device for setting the bias to said gate of said third field effect device.

28. The amplifier of claim 22 wherein said first field effect device comprises first and second field effect transistors coupled to form said first field effect device, each said field effect transistor having a gate, a drain and a source, said gate of said first field effect transistor forming said gate of said first field effect device, said source of said first field effect transistor and said gate of said second field effect transistor being coupled together to form said source of said first field effect device, and said drain of said second field effect transistor forming said drain of said first field effect device.

29. The amplifier of claim 28 wherein said second field effect device comprises third and fourth field effect transistors coupled to form said second field effect device, each said field effect transistor having a gate, a drain and a source, said gate of said third field effect transistor formed said gate of said second field effect device, said source of said third field effect transistor and said gate of said fourth field effect transistor being coupled together to form said source of said second field effect device, and said drain of said fourth field effect transistor forming said drain of said second field effect device.

30. The amplifier of claim 22 wherein at least one of said first and second field effect devices comprises a cascode connection of field effect transistors.

31. The amplifier of claim 30 wherein said cascode connection of field effect transistors comprises an AC cascode connection.

32. The amplifier of claim 22 wherein said cascode connection of field effect transistors comprises a DC cascode connection.

33. The amplifier of claim 32 wherein said cascode connection of field effect transistors comprises at least said first field effect device.

34. The amplifier of claim 22 wherein at least one of said first and second field effect devices comprises a stacked cascode connection of field effect transistors.

35. The amplifier of claim 34 wherein said stacked cascode comprises an AC stacked cascode.

36. The amplifier of claim 34 wherein said stacked cascode comprises a DC stacked cascode.

37. The amplifier of claim 34 wherein said stacked cascode connection of field effect transistors comprises at least said first field effect device.

38. The amplifier of claim 22 wherein at least one of said field effect devices comprises a connection of field effect and bipolar transistors emulating a field effect device.

39. The amplifier of claim 22 wherein each of said field effect devices comprise a connection of field effect and bipolar devices emulating the respective field effect.

* * * * *